(12) United States Patent
Wang et al.

(10) Patent No.: US 8,037,918 B2
(45) Date of Patent: Oct. 18, 2011

(54) PICK-UP HEADS AND SYSTEMS FOR DIE BONDING AND RELATED APPLICATIONS

(75) Inventors: Ya Ping Wang, Shanghai (CN); Jian Ming Yang, Shanghai (CN); Guo Qiang Shen, Shanghai (CN); Chee Keong Chin, Shanghai (CN)

(73) Assignee: Stats Chippac, Inc., Fremont, CA (US)

( * ) Notice: Subject to any disclaimer, the term of this patent is extended or adjusted under 35 U.S.C. 154(b) by 528 days.

(21) Appl. No.: 11/633,701

(22) Filed: Dec. 4, 2006

(65) Prior Publication Data

US 2008/0128081 A1 Jun. 5, 2008

(51) Int. Cl.
| | |
|---|---|
| B29C 65/00 | (2006.01) |
| B32B 37/00 | (2006.01) |
| B31F 5/00 | (2006.01) |
| B65C 9/08 | (2006.01) |
| B65H 29/00 | (2006.01) |
| B65G 47/91 | (2006.01) |
| B65G 1/133 | (2006.01) |
| B66C 1/00 | (2006.01) |
| B66C 3/00 | (2006.01) |
| A47J 45/00 | (2006.01) |

(52) U.S. Cl. ..... 156/538; 156/285; 156/556; 414/752.1; 414/627; 414/737; 294/64.1; 901/40

(58) Field of Classification Search ............ 156/60, 156/285, 286, 295, 538, 539, 556, 559, 572; 29/25.01, 740, 743; 257/777, 782, 783; 294/64.1, 294/64.3; 414/627, 737, 749.1, 752.1, 941; 438/106, 455; 901/40

See application file for complete search history.

(56) References Cited

U.S. PATENT DOCUMENTS

| | | | | |
|---|---|---|---|---|
| 4,381,601 A | * | 5/1983 | Tamai et al. | 29/740 |
| 4,752,180 A | * | 6/1988 | Yoshikawa | 414/737 |
| 4,875,279 A | | 10/1989 | Sakiadis | |
| 4,980,971 A | * | 1/1991 | Bartschat et al. | 29/833 |
| 5,129,827 A | * | 7/1992 | Hoshi et al. | 438/457 |
| 5,169,196 A | | 12/1992 | Safabakhsh | |
| 5,415,331 A | * | 5/1995 | Lin | 228/213 |
| 6,491,574 B1 | * | 12/2002 | Farnworth | 451/339 |
| 6,742,561 B2 | | 6/2004 | Nam et al. | |
| 6,995,468 B2 | | 2/2006 | Abe et al. | |
| 2005/0221582 A1 | * | 10/2005 | Lee et al. | 438/455 |

* cited by examiner

*Primary Examiner* — Michael Tolin
*Assistant Examiner* — Brian R Slawski

(57) ABSTRACT

Pick-up heads and systems are especially useful for picking up, transporting, and placing semiconductor dies at bond sites on packaging substrates. Alternatively, the heads and systems are useful for performing these tasks with any of various other planar objects. An exemplary head includes a shank and a body. The body includes a compliant end portion contactable by the shank, and the end portion includes a face. The shank is movable relative to the end portion such that, whenever the shank is retracted, the face has a substantially planar contour, and whenever the shank is extended, the shank contacts and urges the end portion to provide the face with a convex contour. The end portion desirably defines at least one vacuum orifice connected to an evacuation device (e.g., a vacuum pump) that evacuates the vacuum orifice sufficiently to cause the planar object to adhere to the face.

16 Claims, 4 Drawing Sheets

PICK-UP HEADS AND SYSTEMS FOR DIE BONDING AND RELATED APPLICATIONS

FIELD

This disclosure pertains to, inter alia, tools for fabricating semiconductor integrated circuits and other micro-electronic devices. More specifically, the disclosure pertains to pick-up tools and heads used for picking up small planar objects, notably semiconductor "chips" (also called "dies") for placement over a destination site, and lowering the object onto the destination site for attaching the object at the destination site.

BACKGROUND

Dies are respective portions of semiconductor wafers that have been cut up into individual units after completion of wafer-fabrication steps. Each die has substantially all its specified circuit layers and is ready for packaging to make finished devices.

A die pick-up tool comprises a pick-up "head" mounted to and controllably moved by a robotic mechanism. The die pick-up head is the actual device that picks up the die for movement into position for execution of a die-packaging step that usually involves bonding the die to a substrate.

Die packaging is normally the final process in the long chain of processes for manufacturing semiconductor integrated circuits and the like. Die packaging is a multi-disciplinary technology that typically involves many steps. The technology is critically important because it has a direct impact on device performance and reliability. "Packaging" as used herein encompasses any of various techniques of preparing a die for actual use as an electronic device. In many instances, packaging includes mounting the die on a lead-frame or analogous item and encapsulating the die to seal and protect the die from the external environment, while allowing peripheral portions of the lead-frame to extend outside the package for making external electrical connections to and from the die. Packaging also can facilitate the conduction of heat away from the die during use. More recent types of packaging, currently being used increasingly widely, simply involve mounting the die on a substrate or carrier, with which the die directly makes the required external connections, without forming a discrete capsule around the individual die beforehand (and usually without using a lead-frame). Modern "flip-chip" packaging schemes are in this latter category.

Die packaging is prefaced by wafer dicing and/or scribing by which a wafer that has completed the various "wafer-fabrication" steps is cut up into individual dies. The combined processes of dicing and packaging are usually called semiconductor "assembly" processes. During dicing, the finished semiconductor wafer is cut using a dicing saw, laser beam, or the like so as to separate the dies from one another.

In substantially all packaging operations involving dies, each die is bonded to some kind of substrate (e.g., ceramic, metal, plastic, or other suitable material) to provide the die with mechanical support, ruggedness, and a heat-removal capability. Mounting dies to substrates involves sophisticated robotics that execute the required steps in a highly accurate and precise manner while ensuring an adequate level of process cleanliness, achieving a desired rate of processing ("throughput"), and avoiding damage to the delicate dies. To bond a die to a bond site on a substrate, the die typically is picked up by a die pick-up head (sometimes called a "collet") that is robotically moved into position adjacent (usually vertically above) the bond site. A small amount of adhesive is placed between the die and bond site, and the pick-up head is moved to lower the die onto and adhere the die to the bond site.

A conventional die pick-up head comprises a die-contact face (usually facing downward) that is supported (usually from above) by a stem. The face usually is made of a compliant material to avoid damaging the surface of the die. At least one vacuum-orifice opens onto the face. The vacuum-orifice is connected to a conduit that usually extends upward inside the stem. The conduit is connected to a vacuum pump. Whenever the face is in close proximity to a die for pick-up, the conduit and orifice are evacuated by the pump to attract and hold the die to the face. The die remains held to the face so long as the vacuum in the conduit is maintained. Meanwhile, the head moves the die into position over a bond site on the substrate and lowers the die onto the bond site. At time of placement of the die at the bond site, evacuation of the conduit and orifice is halted to release the die from the face.

The adhesive is applied to the bond site before the die is lowered onto the bond site. The amount of adhesive and the manner of applying it are tightly controlled. A widely used method is providing the adhesive in the form of a flexible film (called "die attach") that is robotically applied to the bond site. Bonding a die to the substrate using a die attach usually is prefaced by localized application of heat or other energy to the bond site to soften the die attach sufficiently for achieving a bond while avoiding excessive liquefaction of the adhesive. In other die-bonding processes adhesive (e.g., epoxy) is applied as a small dollop to the bond site just before lowering the die onto it.

In most conventional die pick-up heads, the face is planar. Examples of planar-head faces are discussed in U.S. Pat. No. 4,875,279 to Sakiadis; U.S. Pat. No. 6,742,561 to Nam et al., and U.S. Pat. No. 6,995,468 to Abe et al., all incorporated herein by reference.

After placement of the die on the bond site, and while the adhesive is sufficiently softened, the pick-up head usually applies a small amount of downward force to the die to cause the adhesive to spread out between the die and bond site and thus form a thin adhesive film between the die and bond site. A persistent problem with this approach, particularly when using heads having planar faces, is the frequent formation of "film voids" (empty regions in the adhesive film due to entrapped or drawn-in air) between the die and bond site. Film voids are not visible, and thus are not readily detectable, but they can substantially reduce heat conduction from the die to the substrate in a finished device. Poor heat conduction can result in increased probability of device failure. Film voids also can substantially reduce the ruggedness of the finished device.

Unfortunately, current approaches for solving the problem of film voids, such as using pick-up heads having curved faces, have shown some promise with respect to achieving good bonding. But, pick-up heads in general do more than simply bond the die; they must also be very effective in picking up dies and transporting them without mishap. Unfortunately, current pick-up heads having curved faces exhibit difficulty in consistently maintaining the desired vacuum for holding the die to the face. As a result, the pick-up heads exhibit less than optimal performance of holding and transferring dies, especially when used at high speed and/or when manipulating large dies.

In view of the foregoing, a need exists for die pick-up tools and heads that perform all three tasks (pick-up, transport, and bonding) with a very high degree of consistent and reliable performance at high-speed operation and with large dies.

SUMMARY

The foregoing need is satisfied by pick-up heads and systems comprising same, as disclosed herein.

According to a first aspect, pick-up head are provided. An embodiment comprises a shank and a body. The body comprises a compliant end portion contactable by the shank, wherein the end portion includes a face. The shank is movable relative to the end portion such that, whenever the shank is in a retracted position, the face has a substantially planar contour, and whenever the shank is in an extended position, the shank contacts and urges the end portion to provide the face with a convex contour. The end portion desirably defines at least one vacuum orifice that is connected to an evacuation device (e.g., a vacuum pump) that is configured to evacuate the vacuum orifice sufficiently to cause a planar object to adhere to the face.

The retracted position desirably is a pick-up position by which a planar object is picked up by adhesion to the face. The extended position desirably is a placement position by which the picked up planar object is released from the face to a destination site. Hence, the subject heads having this configuration are especially suitable for situations in which the planar object is a semiconductor die, wherein the destination site is a bond site on a substrate (e.g., packaging substrate). In the extended position the convex contour of the face facilitates bonding of the die to the bond site.

Another aspect is directed to die pick-up heads. An embodiment comprises a stem and a body. The stem comprises an outer shank and an inner shank situated relative to the outer shank so as to be slidably movable relative to the outer shank between an extended position and a retracted position. The body comprises an end portion that includes a face extending transversely to the stem and an inner surface that is contactable by the inner shank. Whenever the inner shank is in the retracted position, the end portion assumes a posture by which the face has a substantially planar contour for picking up a die. Whenever the inner shank is in the extended position, the inner shank contacts the inner surface of the end portion and urges the end portion to assume a posture by which the face has a convex contour. The face desirably defines at least one orifice connected to a vacuum pump or the like that evacuates the orifice sufficiently to cause the die to adhere to the face at least during a time in which the inner shank is in the retracted position.

The face desirably is configured to hold the die at least during a time in which the inner shank is in the retracted position.

The inner shank desirably comprises a distal end. The distal end can be configured to contact the inner surface of the end portion whenever the inner shank is in the retracted position and whenever the inner shank is in the extended position. In another embodiment the inner shank comprises a transverse plate coupled to the distal end of the inner shank, wherein the transverse plate has a distal surface. In this embodiment, the transverse plate contacts the inner surface of the end portion such that the face has a substantially planar contour when the inner shank is in the retracted position and a convex contour whenever the inner shank is in the extended position. The distal surface of the transverse plate desirably is convex.

According to another aspect, pick-up systems are provided. An embodiment comprises a pick-up head comprising a shank and a body comprising a compliant end portion that is contactable by the shank. The end portion includes a face. The shank is movable relative to the end portion such that, whenever the shank is in a retracted position, the face has a substantially planar contour, and whenever the shank is in an extended position, the face has a convex contour. The system also includes a robot to which the pick-up head is mounted. The robot is configured to move the pick-up head back and forth between a first location and a second location. The retracted position is a pick-up position by which a planar object is picked up at the first location by adhesion of the object to the face, and the extended position is a placement position by which the picked up planar object is released from the face to a destination site at the second location. For example, if the planar object is a semiconductor die, the destination site can be a bond site on a substrate located at the second location, wherein in the extended position the convex contour of the face facilitates bonding of the die to the bond site.

According to yet another aspect, die pick-up and bonding systems are provided. An embodiment comprises a die pick-up head that comprising a stem and a body. The stem comprises an outer shank and an inner shank that is slidably movable relative to the outer shank between an extended position and a retracted position. The body comprises an end portion including a face extending transversely to the stem and an inner surface contactable by the inner shank. Thus, whenever the inner shank is in the retracted position, the end portion assumes a posture by which the face has a substantially planar contour for picking up a die, and whenever the inner shank is in the extended position, the inner shank contacts the inner surface of the end portion and urges the end portion to assume a posture by which the face has a convex contour. The system also includes a robot to which the pick-up head is mounted. The robot is configured to move the pick-up head back and forth between a die pick-up location and a die-bonding location.

In an embodiment the face has a substantially planar contour whenever the robot has positioned the pick-up head at the die pick-up location and the head is picking up the die at the die pick-up location. The face also has a substantially planar contour whenever the robot is moving the pick-up head, carrying a die, from the die pick-up location to the die-bonding location. The face has a convex contour whenever the robot has moved the pick-up head to the die-bonding location and is placing the die at a bonding site on a substrate positioned at the die-bonding location.

The system desirably further comprises a vacuum system connected to the face so as to cause the die to adhere to the face.

According to yet another aspect, methods are provided for picking up a planar die and bonding the die at a bond site on a substrate. An embodiment of the method comprises presenting to the die a pick-up face shaped to have a substantially planar contour to pick up the die and hold the die. While holding the die with the substantially planar pick-up face, the die is conveyed to the bond site. A bonding agent (e.g., a suitable adhesive or a die attach) is applied in a manner that will position the bonding agent between the die and the bond site when the die is applied to the bond site. The contour of the pick-up face is changed to a convex contour while placing the die on the bonding agent, such that a center region of the die is closer to the bond site than peripheral regions of the die. Using the convex-contoured pick-up face, the die is urged further onto the bonding agent to bond the die to the bond site. Desirably, the die is urged further onto the adhesive in a manner that causes net flow of bonding agent from the center region of the die to the peripheral regions of the die contacted by the adhesive, so as to avoid formation of film voids.

The foregoing and additional features and advantages of the invention will be more readily apparent from the following detailed description, which proceeds with reference to the accompanying drawings.

DETAILED DESCRIPTION

This disclosure is set forth in the context of representative embodiments that are not intended to be limiting in any way.

In the following description, certain terms may be used such as "up," "down,", "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Figure 1A:
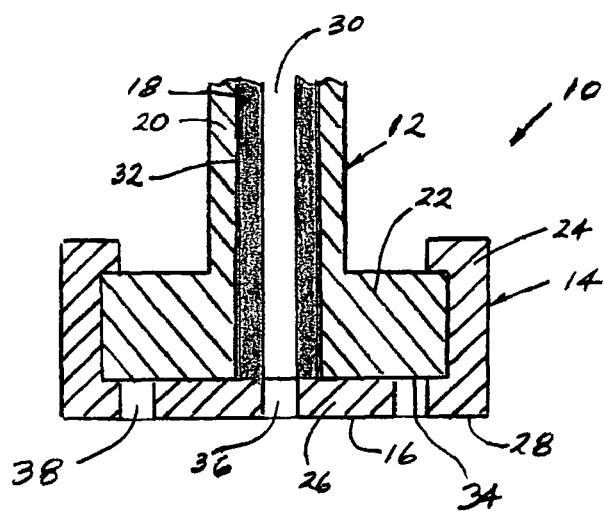
FIGS. 1(A)-1(B) are elevational sections of a pick-up head according to a first representative embodiment, depicting retracted and extended positions, respectively.
Figure 1B:
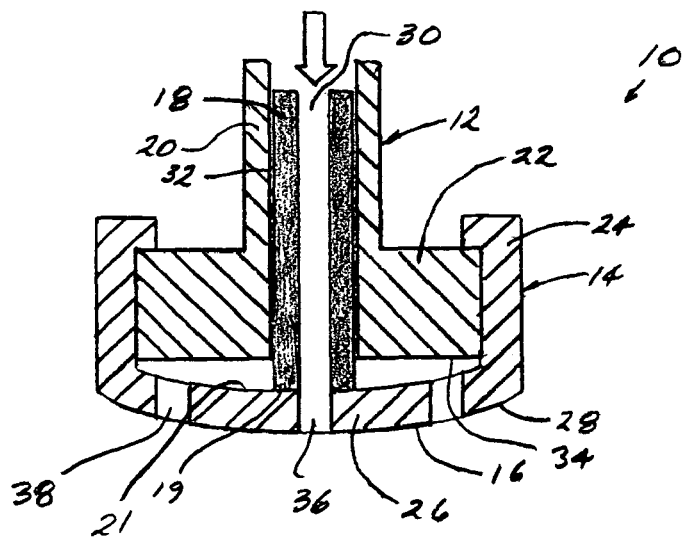

A first representative embodiment of a pick-up head 10 is shown in FIGS. 1(A)-1(B). The pick-up head 10 comprises a stem 12, a body 14, and a face 16. The stem 12 comprises an inner shank 18 and an outer shank 20. The body 14 comprises an inner portion 22, an outer portion 24, and an end portion 26. As discussed later below, the end portion 26 is contiguous with the outer portion 24 in this embodiment. The outer shank 20 is mounted to or contiguous with (the latter as shown) the inner portion 22. The inner shank 18 is mounted to, or at least distally contacts, the inner surface of the end portion 26. The outer portion 24 is in surrounding relationship to the inner portion 22. The outer portion 24 surrounds the bottom of the inner portion 22 and surrounds the sides of the inner portion 22. The outer portion 24 also partially surrounds a top surface of the inner portion 22. The face 16 is defined by both the end portion 26 and an edge region 28 of the outer portion 24. The inner shank 18 includes a vacuum conduit 30 that is connected to a vacuum pump (not shown) in a conventional manner. The end portion 26 and at least the edge region 28 (and desirably also the outer portion 24) are made of a compliant, inert material (such as silicone rubber, Buna-N rubber, Viton rubber, or other suitable material). The shanks 18, 20 and inner portion 22 desirably are made of a rigid, inert material such as stainless steel, ceramic, or other suitable material.

The inner shank 18 is slip-fit coaxially into a bore 32 that extends in the outer shank and through the inner portion 22. The inner shank 18 is actuated to move axially relative to the outer shank 20. The inner shank also has a transverse distal end 19 available to contact the inner surface 21 of the end portion 26. The distal end 19 can be substantially planar, as shown, or have another contour such as somewhat rounded (convex).

Movement of the inner shank 18 relative to the outer shank 20 affects the contour of the face 16 as follows. During die pick-up and transport, the inner shank 18 is in a retracted ("upward") position as shown in FIG. 1(A). In the retracted position, the distal end 19 can remain in contact with the inner surface 21 or be retracted from the inner surface 21. In either event, retraction of the inner shank 18 results in relaxation of the end portion 26 and edge regions 28 against the planar transverse face 34 of the inner portion 22. This relaxation causes the face 16 to assume a substantially planar contour which is suitable for picking up and transporting dies (which are substantially planar), while avoiding mis-pick-ups.

For die release over the bond site of the substrate, the inner shank 18 is actuated to move axially "downward" relative to the outer shank 20, in a manner that results in an extended position as shown in FIG. 1(B). This extension urges the distal surface 19 of the inner shank 18 against the inner surface 21, which causes at least the end portion 26 (and desirably the edge regions 28 also) to assume a convex contour, which is suitable for pressing the die against the adhesive at the bond site.

It will be understood that the downward motion of the inner shank 18 relative to the outer shank 20 is typically very slight, resulting in a very small degree of convexity of the face 16. This downward motion can be achieved by any of various "micro-actuators" such as a micro-solenoid, a micro-motor, a voice-coil motor, or a piezo-electric actuator.

As a result of the face 16 assuming a slight convexity, as a die held on the face is urged by the face toward the bond site, the center of the die is urged onto the adhesive first. As the die is urged further onto the adhesive, the pressure exerted by the die on the adhesive is greatest at the center of the die and extends outward from the center of the die. The resulting pressure gradient applied by the die to the adhesive effectively urges air bubbles and other film voids in the adhesive to propagate outwardly from the die center toward the edges of the die, which prevents entrapment of film voids in the adhesive film between the die and the bond site. The slight convexity of the face in the posture shown in FIG. 1(B) is not only effective for preventing film voids but also avoids fracturing the die as the die is being urged by the face into the adhesive.

Figure 2:
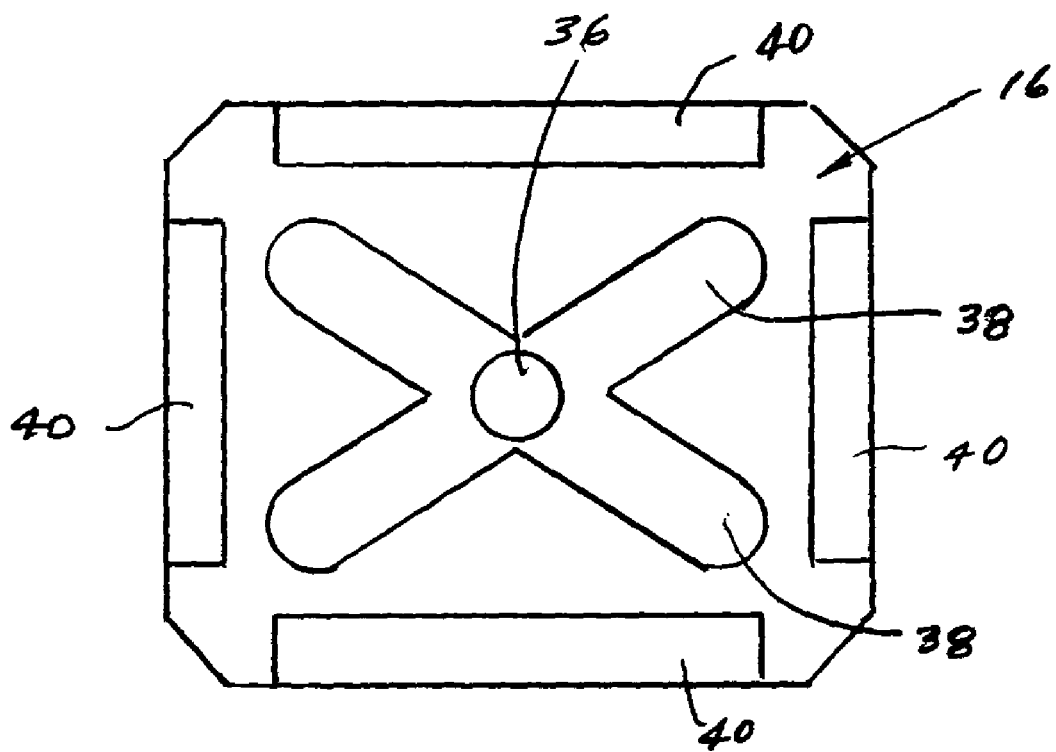
FIG. 2 is a plan view of an exemplary face of any of various embodiments of a pick-up head.

The vacuum conduit 30 opens at least as one vacuum orifice 36 onto the face 16. (The depicted orifice 36 in this embodiment is situated in the center of the face 16.) Alternatively, the face 16 can have multiple vacuum orifices as required, situated at respective locations on the face, connected directly or indirectly to the vacuum conduit 30. In addition or further alternatively, as shown in FIG. 2, the face 16 can define one or more vacuum channels 38 that extend depthwise part-way into the end portion 26 and extend outward from the vacuum orifice 36. The channels 38 extend the vacuum-holding effect over a substantial portion of the face 16, compared to relying only on a single vacuum orifice. The vacuum channels 38 also reduce the incidence of damage to the die caused by contact of the die with the face 16. The face 16 also can include edge ridges 40 that serve to center and orient the die on the face 16 whenever the die is being held on the face.

Figure 3A:
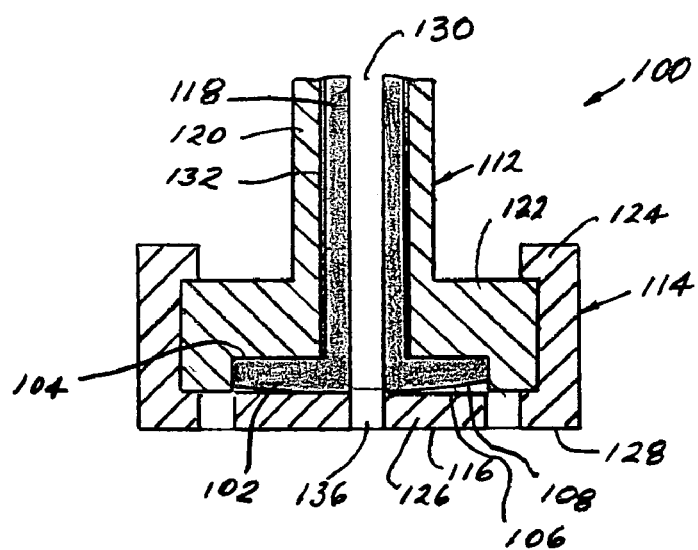
FIGS. 3(A)-3(B) are elevational sections of a pick-up head according to a second representative embodiment, depicting retracted and extended positions, respectively.
Figure 3B:
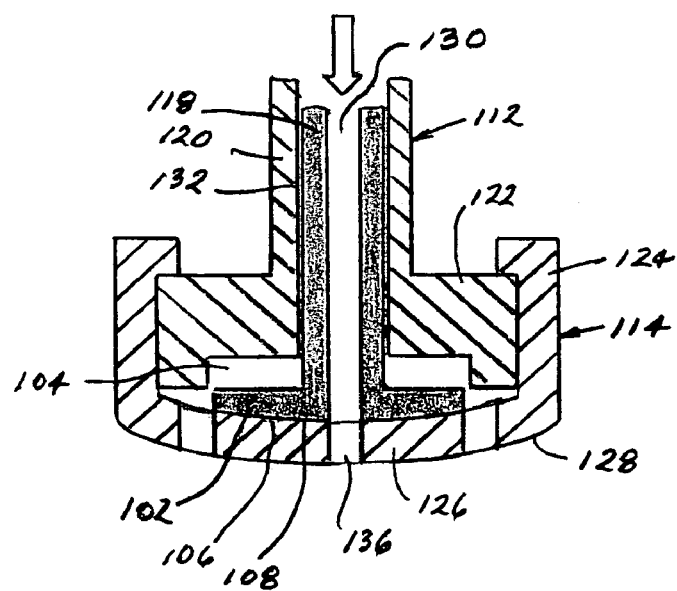

A second representative embodiment of a pick-up head is shown in FIGS. 3(A)-3(B). The pick-up head 100 comprises a stem 112, a body 114, and a face 116. The stem 112 comprises an inner shank 118 and an outer shank 120. The body 114 comprises an inner portion 122, an outer portion 124, and an end portion 126. As in the first representative embodiment, the end portion 126 desirably is contiguous with the outer portion 124. The outer shank 120 is mounted to or contiguous with (the latter as shown) the inner portion 122. The inner shank 118 is mounted to or contiguous with (the latter as shown) a transverse plate 102 that contacts the inner surface of the end portion 126. In the retracted mode shown in FIG.

3(A), the transverse plate 102 is nested in a recess 104 defined in the face 106 of the inner portion 122. The outer portion 124 is in surrounding relationship to the inner portion 122. The outer portion 124 surrounds the bottom of the inner portion 122 and surrounds the sides of the inner portion 122. The outer portion 124 also partially surrounds a top surface of the inner portion 122. The face 116 is defined by both the end portion 126 and an edge region 128 of the outer portion 124. The inner shank 118 includes a vacuum conduit 130 that is connected to a vacuum pump (not shown) in a conventional manner. The end portion 126 and at least the edge region 128 (and optionally the outer portion 124) are made of a compliant, inert material (such as listed in the first representative embodiment). The shanks 118, 120 and inner portion 122 desirably are made of a rigid, inert material such as described in the first representative embodiment.

The inner shank 118 is slip-fit coaxially into a bore 132 that extends in the outer shank and through the inner portion 122. The inner shank 118 is actuated, as described in the first representative embodiment, to move axially relative to the outer shank 120. Such movement affects the contour of the face 116 as follows. The transverse plate 102 has a distal face 108 that desirably is slightly convex. (Alternatively, the distal face 108 can be substantially planar.) During die pick-up and transport, the inner shank 118 is in a retracted position as shown in FIG. 3(A). As a result, the end portion 126 and edge regions 128 are in a "relaxed" posture. Even though the distal face 108 is slightly convex in this embodiment, the face 116 relaxed against it still assumes a substantially planar contour. As noted, the planar contour of the face 116 is suitable for picking up and transporting dies (which are substantially planar).

During die release at the bond site of the substrate, the inner shank 118 is actuated to move axially relative to the outer shank 120, but in a manner that results in an extended position as shown in FIG. 3(B). Actuation of the inner shank 118 urges the distal face 108 against the inner surface of the end portion 126, which causes the end portion and edge regions 28 to assume a slightly convex contour. The breadth of the transverse plate 102, in contrast to the comparatively narrow distal end of the inner shank 18 in the first embodiment, reduces concentration of stress on the inner surface of the end portion 126. Stress is further reduced if the distal face 108 is slightly convex as shown.

As described above, the convex contour of the face 116 is optimal for urging the die (center first) against the adhesive at the bond site, resulting in a radial application of pressure that effectively moves air bubbles and other film voids in the adhesive outwardly toward the edges of the die. As in the first embodiment, entrapment of film voids in the adhesive film between the die and the bond site is prevented, while also preventing fracture of the die.

In the depicted embodiment, the vacuum conduit 130 opens at least into one vacuum orifice 136 on the face 116, substantially at the center of the face. Alternatively, as in the first embodiment, the face 116 can have multiple vacuum orifices, and can define one or more vacuum channels. The face 116 also can include edge ridges (not shown).

This second representative embodiment is especially suitable for handling large and/or thin dies without damaging them.

The subject die pick-up heads and systems can be used for attaching single dies to respective bond sites, and for attaching multiple dies to a single bond site. With respect to the latter, the subject heads and systems can be used in a process as discussed, for example, in U.S. Pat. No. 6,995,468 to Abe et al., cited above and incorporated herein by reference. Specifically, the '468 patent discusses mounting a first die at a bond site, and then bonding a second die superposedly atop the first die.

Figure 4:
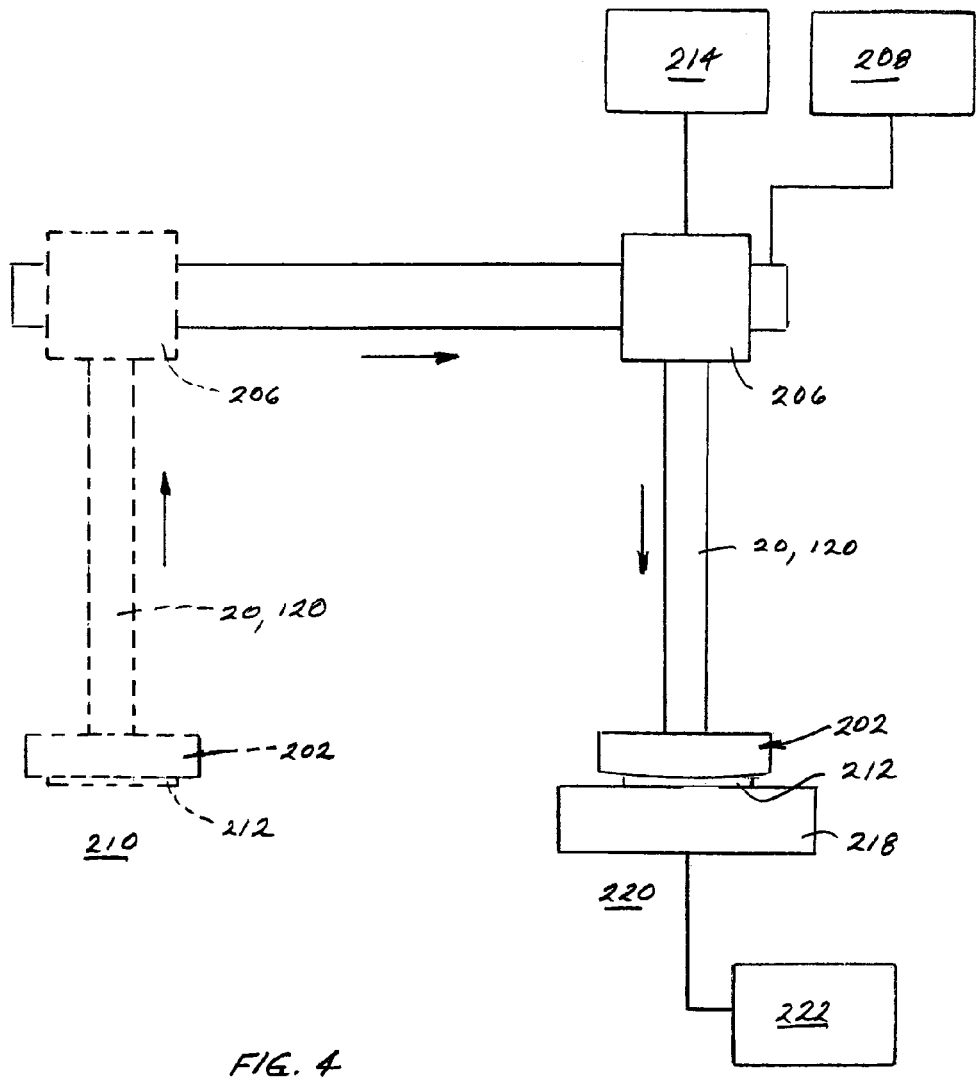
FIG. 4 is a schematic depiction of an embodiment of a die pick-up system including a pick-up head such as either of the first and second embodiments thereof.

An exemplary die pick-up system 200, comprising a pick-up head 202 according to any of the subject embodiments, is shown in FIG. 4. The pick-up head 202 is mounted to a robot 204. The head 202 is mounted to a movable portion 206 of the robot 204 so that movement of the movable portion 206 causes corresponding movement of the head. The movable portion 206 typically is configured to perform movements in at least one "horizontal" direction (x-direction shown) as well as in the "vertical" direction (z-direction). Motion of the movable portion 206 and other operational aspects of the robot 204 are controlled by a controller 208 coupled to the robot 204. For example, as shown in the figure, the robot 204 moves the movable portion 206 and pick-up head to a pick-up site 210 (all denoted by dashed lines). At the pick-up site 210 the movable portion 206 moves the head 202 downward toward a die 212. Application of a vacuum produced by a vacuum pump 214 causes the head 202 to pick up the die 212. The robot 204 then moves the movable portion 206 (with head 202 and die 212) to a second location 216 at which a substrate 218 has been placed. Adhesive (not shown) is added to a bond site 220 on the substrate 218, and a heater 222 imparts local heating of the bond site to prepare the adhesive for bonding. The movable portion 206 moves the head 202 (carrying the die 212) "downward" toward the bond site 220. In the pick-up head 202, the inner shank moves relative to the outer shank as described in the embodiments above to provide convexity to the face of the head, and the movable portion 206 places the die 212 on the adhesive at the bond site 220. Vacuum applied to the face of the head 202 is turned off, and a slight further downward movement of the movable portion 206 applies pressure to the die 212 on the adhesive to cause the adhesive to bond the die to the bond site 220 while avoiding formation of film voids as described above. After completion of bonding, the head 202 is moved vertically upward away from the substrate 218 by the movable portion 206, and the robot 204 moves the movable portion (and head) back to the pick-up site 210 to pick up another die 212.

Whereas the foregoing description is in the context of representative embodiments, the invention is not limited to those embodiments. On the contrary, the invention is intended to encompass all modifications, alternatives, and equivalents as may be included in the spirit and scope of the invention, as defined by the appended claims.

What is claimed is:

1. A pick-up head, comprising:
   a shank having a distal end;
   a transverse plate coupled to the distal end of the shank, the transverse plate having a distal surface;
   a body comprising an inner portion made of a rigid material, an outer portion partially surrounding a top surface of the inner portion, and an end portion contactable by the shank, the end portion and the outer portion made of a compliant material with the end portion including a face;
   the shank having a distal end being movable relative to the end portion such that, whenever the shank having a distal end is in a retracted position, the face has a substantially planar contour with edge ridges to center and orient a die on the face, and whenever the shank having a distal end is in an extended position, the shank having a distal end contacts and urges the end portion to provide the face with a convex contour for releasing the die.

2. The pick-up head of claim 1, wherein the end portion defines at least one vacuum orifice connected to an evacuation device configured to evacuate the vacuum orifice sufficiently to cause a planar object to adhere to the face.

3. The pick-up head of claim 1, wherein:
the retracted position is a pick-up position by which a planar object is picked up by adhesion to the face; and
the extended position is a placement position by which the picked up planar object is released from the face to a destination site.

4. The pick-up head of claim 3, wherein:
the planar object is a semiconductor die;
the destination site is a bond site on a substrate; and
in the extended position the convex contour of the face facilitates bonding of the die to the bond site.

5. A die pick-up head, comprising:
a stem comprising an outer shank and an inner shank having a distal end situated relative to the outer shank so as to be slidably movable relative to the outer shank between an extended position and a retracted position;
a transverse plate coupled to the distal end of the inner shank, the transverse plate having a distal surface;
a body comprising an inner portion made of a rigid material, an outer portion partially surrounding a top surface of the inner portion, and an end portion, the end portion and the outer portion made of a compliant material with the end portion including a face extending transversely to the stem and an inner surface contactable by the inner shank, the face having edge ridges to center and orient a die on the face; and
wherein, whenever the inner shank is in the retracted position, the end portion assumes a posture by which the face has a substantially planar contour for picking up a die, and whenever the inner shank is in the extended position, the inner shank contacts the inner surface of the end portion and urges the end portion to assume a posture by which the face has a convex contour for releasing the die.

6. The pick-up head of claim 5, wherein the face defines at least one orifice connected to a vacuum pump that evacuates the orifice sufficiently to cause the die to adhere to the face at least during a time in which the inner shank is in the retracted position.

7. The pick-up head of claim 5, wherein the face is configured to hold the die at least during a time in which the inner shank is in the retracted position.

8. The pick-up head of claim 5, wherein:
the inner shank comprises a distal end; and
the distal end contacts the inner surface of the end portion whenever the inner shank is in the retracted position and whenever the inner shank is in the extended position.

9. The pick-up head of claim 5, wherein the face defines at least one vacuum channel.

10. A pick-up system, comprising:
a pick-up head comprising a shank; a transverse plate coupled to the distal end of the shank, the transverse plate having a distal surface;
a body comprising an inner portion made of a rigid material, an outer portion partially surrounding a top surface of the inner portion, and an end portion that is contactable by the shank, the end portion and the outer portion made of a compliant material with the end portion including a face with edge ridges to center and orient a' die on the face and the shank being movable relative to the end portion such that, whenever the shank is in a retracted position, the face has a substantially planar contour, and whenever the shank is in an extended position, the face has a convex contour for releasing the die; and a robot to which the pick-up head is mounted, the robot being configured to move the pick-up head back and forth between a first location and a second location.

11. The system of claim 10, wherein:
the retracted position is a pick-up position by which a planar object is picked up at the first location by adhesion of the object to the face; and
the extended position is a placement position by which the picked up planar object is released from the face to a destination site at the second location.

12. The system of claim 11, wherein:
the planar object is a semiconductor die;
the destination site is a bond site on a substrate located at the second location; and
in the extended position the convex contour of the face facilitates bonding of the die to the bond site.

13. A die pick-up and bonding system, comprising:
a die pick-up head, comprising a stem and a body, the stem comprising an outer shank and an inner shank that is slidably movable relative to the outer shank between an extended position and a retracted position;
a transverse plate coupled to the distal end of the inner shank, the transverse plate having a distal surface; the body comprising an inner portion made of a rigid material, an outer portion partially surrounding a top surface of the inner portion, and an end portion, the end portion and the outer portion made of a compliant material with the end portion including a face extending transversely to the stem with edge ridges to center and orient a die on the face and an inner surface contactable by the inner shank, such that, whenever the inner shank is in the retracted position, the end portion assumes a posture by which the face has a substantially planar contour for picking up a die, and whenever the inner shank is in the extended position, the inner shank contacts the inner surface of the end portion and urges the end portion to assume a posture by which the face has a convex contour for releasing the die; and
a robot to which the pick-up head is mounted, the robot being configured to move the pick-up head back and forth between a die pick-up location and a die-bonding location.

14. The system of claim 13, wherein:
the face has a substantially planar contour whenever the robot has positioned the pick-up head at the die pick-up location and the head is picking up the die at the die pick-up location;
the face has a substantially planar contour whenever the robot is moving the pick-up head, carrying a die, from the die pick-up location to the die-bonding location; and
the face has a convex contour whenever the robot has moved the pick-up head to the die-bonding location and is placing the die at a bonding site on a substrate positioned at the die-bonding location.

15. The system of claim 13, further comprising a vacuum system connected to the face so as to cause the die to adhere to the face.

16. The system of claim 13, wherein:
the inner shank comprises a distal end; and
the distal end of the inner shank contacts the inner surface of the end portion whenever the inner shank is in the retracted position and whenever the inner shank is in the extended position.

* * * * *